United States Patent [19]

Endo et al.

[11] Patent Number: 4,849,323

[45] Date of Patent: Jul. 18, 1989

[54] PATTERN FORMING METHOD USING CONTRAST ENHANCED MATERIAL

[75] Inventors: Masayuki Endo, Izumi; Masaru Sasago, Hirakata; Kazufumi Ogawa, Osaka, all of Japan

[73] Assignee: Matsushita Electric Industrial Co., Ltd., Osaka, Japan

[21] Appl. No.: 83,199

[22] Filed: Aug. 10, 1987

[30] Foreign Application Priority Data

Aug. 12, 1986 [JP] Japan .................. 61-189063

[51] Int. Cl.⁴ ............................................... G03F 7/26
[52] U.S. Cl. .................................. 430/326; 430/141; 430/185; 430/187; 430/299; 430/311; 430/312; 430/327; 430/329
[58] Field of Search ............... 430/312, 311, 326, 328, 430/329, 327, 325, 185, 187, 299, 141

[56] References Cited

U.S. PATENT DOCUMENTS

| | | | |
|---|---|---|---|
| 2,198,827 | 4/1940 | Leuch | 430/187 |
| 2,277,409 | 3/1942 | Murray | 430/187 |
| 2,336,309 | 12/1943 | Snell et al. | 430/185 |
| 2,405,523 | 8/1946 | Sease et al. | 430/163 |
| 2,690,968 | 10/1954 | Powers | 430/197 |
| 3,591,381 | 7/1971 | Gray et al. | 430/163 |
| 4,569,897 | 2/1986 | Kalyanaraman | 430/197 |

FOREIGN PATENT DOCUMENTS 161660 11/1985 European Pat. Off. ............ 430/312

*Primary Examiner*—Charles L. Bowers, Jr.
*Attorney, Agent, or Firm*—Wenderoth, Lind & Ponack

[57] ABSTRACT

Disclosed is a pattern forming method using contrast enhanced material for enhancing the resolution and contrast when forming patterns in fabrication of semiconductors or the like. This pattern forming method comprises a step of applying a contrast enhanced material for pattern forming on a photoresist, a step of exposing and a step of developing.

The contrast enhanced material is a water-soluble material using a novel diazo compound so that the coefficient A of the contrast may be 10 or more, and when it is combined with g-line exposure to be used in pattern formation, a pattern of 0.5 μm or less may be formed.

The diazo compound may be represented, for example, by

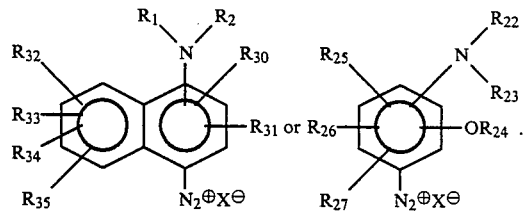

3 Claims, 2 Drawing Sheets

FIG. IA
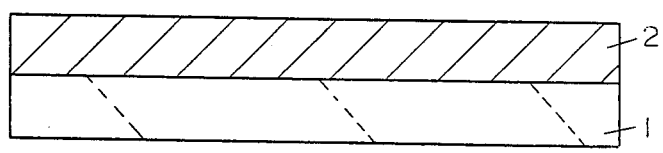
FIG. IB
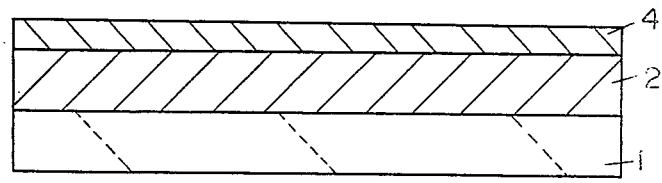
FIG. IC
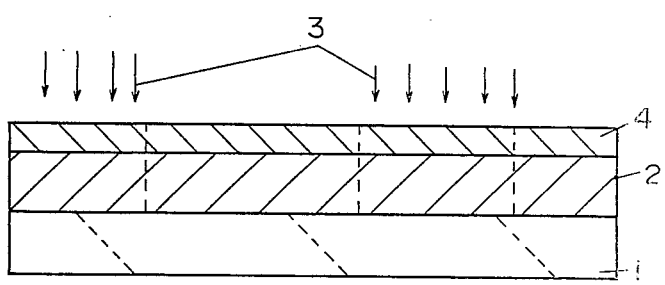
FIG. ID
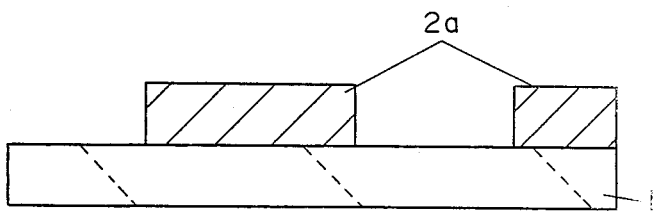

PATTERN FORMING METHOD USING CONTRAST ENHANCED MATERIAL

BACKGROUND OF THE INVENTION

This invention relates to a pattern forming method using contrast enhanced material, and more particularly to a pattern forming method using contrast enhanced material for forming fine patterns capable of further improving the resolution.

Improvement of large scale integration and high density integration of semiconductor integrated circuits has been intensified with the progress of conventional lithographic techniques. The minimum line width has become about 1 μm or so. In order to attain the processed line width, there can be mentioned various means including an ultraviolet ray-exposing method using a wafer stepper with a large numerical aperture (large NA) lens, an electronic beam-exposing method for direct pattern-formation on a support and a proximity exposing method using an X-ray.

Of these means, the first ultraviolet ray-exposing method using a wafer stepper is the best for formation of patterns with no deterioration of throughput.

In 1983, B. F. Griffing et al. (GE Company, U.S.A.) disclosed a method for improving resolving power and pattern form by laminating a contrast-enhanced layer capable of enhancing the contrast of an optical strength profile on a resist for formation of patterns (Contrast Enhanced Photolithograph; B. E. Griffing et al., IEEE-ED, VOL. EDL-4, No. 1, Jan. 1983).

They reported in their disclosure that the resolution of up to 0.4 μm was possible with a wafer stepper (λ; 436 nm, N.A. ; 0.32).

As a result of the study by the present inventors, the characteristics of a pattern-forming organic film for contrast-enhancement will be explained as follows:

In general, an optical strength profile of an output in a wafer stepper is processed by the optical lens system thereof. In more detail, when an ultraviolet ray exposure is effected through a reticle, even though the diffraction-free and ideal input optical strength profile is a complete rectangular wave, the contrast C thereof is represented by the following formula:

$$C = \frac{I_{max} - I_{min}}{I_{max} + I_{min}} \times 100 \, (\%) \quad (1)$$

In this case, the contrast C is 100%. The input wave is, after having passed through the optical lens, subjected to Fourier's conversion in accordance with the transfer function of the optical lens system, and thereafter this becomes an output wave having a form that approximates a cosine wave and the contrast C thereof becomes deteriorated. The deterioration of the contrast has a great influence on the pattern formation, for example, including resolving power and pattern form. In this connection, the contrast required for resist pattern resolution is said to be 60% or more than the characteristic of the resist itself, and if the contrast value C becomes less than 60%, the pattern formation would become impossible.

Under the above situation, it is noted that when the above-mentioned output wave is passed through a pattern-forming organic film having such characteristic curve that the transmission to an ultraviolet ray is apt to be small in the range of a short exposure time (small exposure energy) (that is, increment of $I_{min}$ is small), while the transmission to an ultraviolet ray is apt to be large in the range of a large exposure energy (that is, increment of $I_{max}$ is large), the contrast value C is apt to increase. In order to quantitatively explain the fact in more detail, a parameter as set forth in F. H. Dill et al's report of "Characterization of Positive Photoresist" (by F. H. Dill et al., IEEE-ED, VOL, ED-22, No. 7, Jul., 1975), whieh is an exposure and absorption factor A of a positive resist, is used. In general, A is represented by the following formula (2), and the tendency of enlargement of the value A is desired for contrast enhancement.

$$A = \frac{1}{d} \ln \left[ \frac{T(\infty)}{T(0)} \right] \quad (2)$$

In order to attain the tendency of enlarging the value A, it is necessary to thin the film thickness (d) and to enlarge the ratio of the initial transmission $[T(\infty_0)]$ to the final transmission $[t(\infty)]$.

In the conventional contrast enhanced layer containing photodegradable reagent, the coefficient A of said contrast enhancement is 10 or less. At this level of coefficient, the resolution of the resist pattern is only 0.5 μm or more, and it is impossible to cope with 0.5 μm in the 16-Mbit DRAM (dynamic random access memory), for example, in the memory field when the device is microminiaturized in the future.

The present inventors had proposed to use, as the contrast enhanced material, water-soluble polymer advantageous in semiconductor process, such as pullulan and polyvinylalcohol, but since they are inferior in gas permeability, it was found that pattern defects are caused when the $N_2$ gas and other gases generated from the resist are entrapped in the contrast enhanced layer. This phenomenon is explained by referring to FIG. 3. The gas generated when exposed with light 3 of 436 nm from a positive resist 2 on a semiconductor substrate 1 is taken into a conventional contrast enhanced layer 5, and is left over in the layer 5 as bubbles 6 as shown in FIG. 3A. Such bubbles deteriorate the ground resist pattern at the time of developing, and are transferred on the resist 2, thereby causing defective resist pattern 2a as shown in FIG. 3B. At the same time, in the conventional contrast enhanced layer, the value of A is 10 or less, and the shape becomes inferior in a pattern of 0.5 μm or less as in 2b. When a high performance contrast enhanced layer with a higher contrast enhanced effect is used, the formation of defective resist pattern 2b due to bubbles 6 becomes more obvious, and when the contrast enhancement effect is improved, such defects must be removed more carefully, and it is also necessary to reduce the through-put on the semiconductor process at the same time.

SUMMARY OF THE INVENTION

This invention is intended to present a pattern forming method using contrast enhanced material for forming a pattern so as to obtain a minimum line wtih of resist of 0.5 μm or less at high precision by light of 436 nm (g-line) used in ordinary exposure.

It is another object of this invention to realize formation of a superfine resist pattern, which is advantageous in the semiconductor developing process because of water solubility and does not take in bubbles from the ground resist, and is free from defects and high in precision, without lowering the throughput.

The contrast enhanced material of this invention is a diazo compound with amino substituent group and particularly electron donor group to benzene ring or naphthalene ring in order to set the coefficient A value of contrast enhancement effect about over 10.

That is, this invention uses a contrast enhanced material for pattern forming completely soluble in aqueous solution whether exposed to light or not, containing water and photoreactive reagent represented by general formula (A) or (B) below, or containing water and a compound bonding water-soluble polymer and photoreactive reagent represented by general formula (A) or (B).

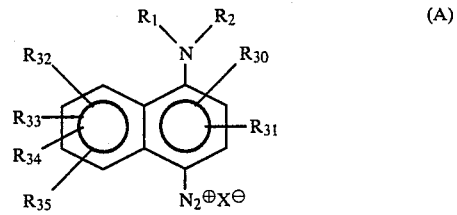

(A)

where R1, R2, R30, R31, R32, R33, R34, R35 are substituent groups, in particular, R30 and R32 are substituent groups other than H atom, and $X^{31}$ is an anion capable of forming a diazonium salt.

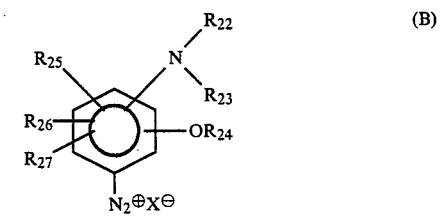

(B)

where R22 to R27 are substituent groups, and $X^-$ is an anion capable of forming a diazonium salt.

Besides, in this invention, preferably, a mixture of a water-soluble organic matter good in gas permeability and a water-soluble organic matter poor in gas permeability is used so as not to take in bubbles from the ground resist at the time of exposure.

The pattern forming method using the pattern forming material of this invention comprises a step of forming a photoresist for pattern forming on a substrate, a step of forming on said photoresist a water-soluble organic film containing a first water-soluble organic compound, a second water-soluble organic compound higher in gas permeability than said first water-soluble organic compound, and a compound having a fading property to light (436 nm) for exposure of said resist so as to absorb said light for exposure, a step of selectively exposing said water-soluble organic film and resist to improve the transmission of the exposed portion of the water-soluble organic film to said light, and a step of formig a pattern of said resist by removing said water-soluble organic film and also removing part of said resist, wherein the value of the natural logarithm, which is the value of dividing the transmission of the water-soluble organic film after irradiation with the light for exposure by the transmission of the same organic film before exposure, being divided by the film thickness (μm) of said water-soluble organic film is about 10 or more.

As a result of review by the present inventors, it has been found that the value of A must be 10 or more in order to form a resist pattern of 0.5 μm or less on the ground resist while improving the contrast enhancement effect. By using the contrast enhanced material of this invention, a resist pattern of 0.5 μm or less may be easily realized without lowering the yield.

Supposing the contrast enhancement coefficient A to be 10 or more and the film thickness of contrast enhanced layer to be 0.3 μm or less, when $$A = \frac{1}{d} \ln\left[\frac{T(\infty)}{T(0)}\right]$$

then $T(0)=3$, $T(\infty)=97$ will be obtained. That is, by employing this invention, the exposure light of 436 nm can be absorbed about more than 97% (the transmission of the light is about less than 3%), and the substantial initial transmission is nearly 0%, and the exposed part after exposure as a nearly 100% transmission, or over 97%, so that resolution of resist pattern of 0.5 μm or less is realized.

Even in such case of high performance contrast enhancement effect, when a mixture of water-soluble compounds differing in gas permeability is used, occurrence of pattern defects due to generation of gas may be further inhibited. Moreover, in this invention, since the resist is developed at the same time when removing the pattern forming contrast enhanced layer, the developing process is easy.

While the novel features of the invention are set forth in the appended claims, the invention, both as to organization and content, will be better understood and appreciated, along with other objects and features thereof, from the following detailed description taken in conjugation with the accompanying drawings.

BRIEF DESCRIPTION OF THE DRAWINGS

FIGS. 1A to D are sectional views of an embodiment of forming a resist pattern by a contrast enhanced material for forming pattern according to this invention;

DETAILED DESCRIPTION OF THE INVENTION

Figure 2:
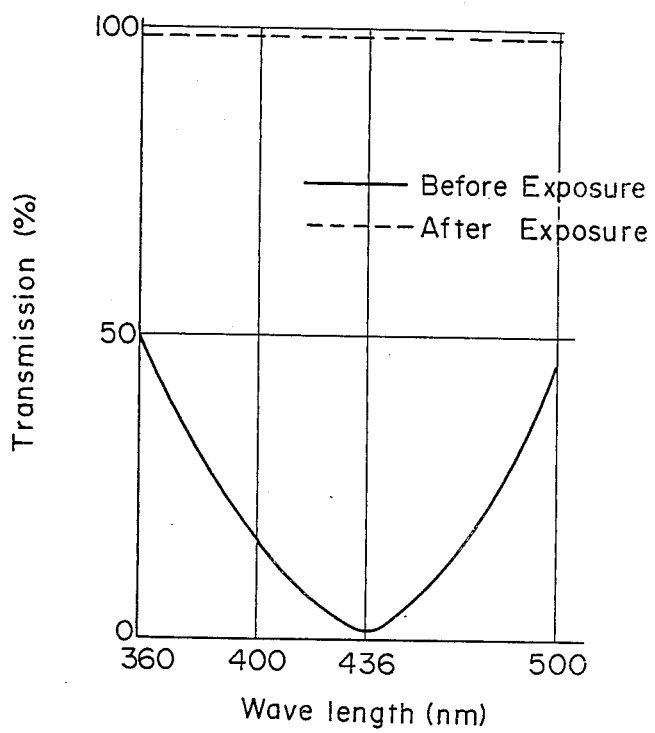
FIG. 2 shows an ultraviolet spectral characteristic before and after exposure of the contrast enhanced material for forming pattern according to this invention.
Figure 3A:
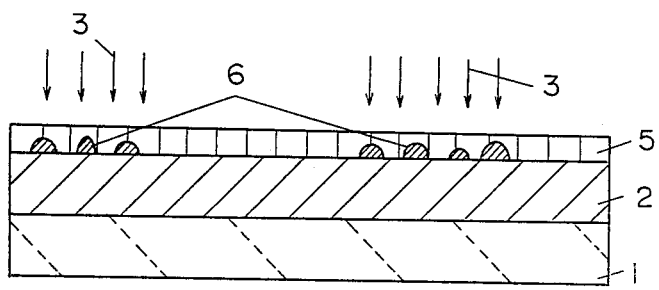
FIGS. 3A and 3B are sectional views of a conventional method of forming a resist pattern by conventional contrast enhanced material for forming pattern.
Figure 3B:
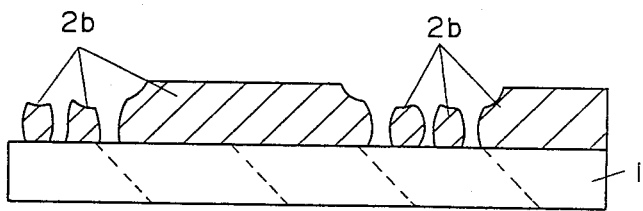

First of all, those preferable as the materials to be used in this invention are stated below. As the compound having a fading property and absorbing light, a diazo fading reagent is used. A diazo fading reagent is soluble in aqueous solution, high in quantum efficiency, and is photodegradable, so that the value of A may be increased higher than the above value. That is, since it is more soluble in aqueous solution, the initial transmission $T(0)$ is smaller, and since it is more likely to be photodegradable, the transmission after exposure $T(\infty)$ is larger. Hence, when applied to the equation $$A = \frac{1}{d} \ln \left[ \frac{T(\infty)}{T(0)} \right]$$

A becomes larger (more than 10), and the effect of contrast enhancement is greater.

However, in the ordinarily used diazo compound (for example,

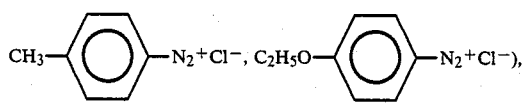

the value of A is not expected over 10. In this invention, therefore, a diazo compound having a substituent value with amino substituent group in the naphthalene ring or benzene ring is used. That is, the amino substituent group can move the absorption peak of the diazo compound by more than 400 nm, and by disposing a substituent group of naphthalene ring or benzene ring, especially an electron donor alkoxy group in the vicinity of the diazo group (position ortho or meta), the absorption peak of the diazo compound may be moved more to 436 nm, and the storage stability of diazo compound is improved as well as the sensitivity is enhanced as the diazo group is more likely to be set free at the time of exposure. The features of such diazo reagents include, among others, the following: when an electron donor group such as amino group, phenyl group and butoxy group is contained within the molecule, the diazo group is more readily set free and the sensitivity is notably improved when the ultraviolet rays for exposure is emitted to the reagent, and when a contrast enhanced material for pattern forming is made by using this reagent, a pattern can be formed with an energy of less than one-sixth (about 50 mJ/cm$^2$) as compared with the general commercial contrast enhanced material, so that the drop of through-put when forming pattern by using a contrast enhanced material for pattern forming may be decreased. Meanwhile, if the electron donor group is within a diazo compound, when the diazo compound is exposed to light, the electron donor group gives electrons so that the diazo group may slip out easily in the excited state, so that the diazo group may be set free easily.

(EXAMPLE 1)

Using 10 g each of pullulan which is a water-soluble organic compound inferior in gas permeability and polyvinyl pyrrolidone made of a water-soluble organic compound excellent in gas permeability to pullulan, 200 cc of mixed aqueous solution of pullulan and polyvinyl pyrrolidone was prepared.

By thus mixing a gas permeable polyvinyl pyrrolidone to a less permeable pullulan, when formed in a film, N$_2$ gas generated from the ground resist when exposed can be removed, and prevention of defect of pattern due to transfer of the bubbles in the film due to N$_2$ gas onto the ground resist may be prevented. The mixing ratio of the permeable compound and the less permeable compound is arbitrary, and as far as a gas permeable compound is present, if very slightly, the molecular arrangement of the less permeable compound can be disturbed, and it is recognized that the gas permeability is dramatically improved.

Incidentally, pullulan is very smoothly soluble in water and its transmission is nearly 100%, and its film forming property is also excellent, and moreover it is insoluble in organic solvent (insoluble in resist film), is not gelled, and is easily mixed with reagent. Because of these excellent features, it is extremely useful to use it as the polymer for pattern forming organic material.

At this time, each polymer was reasily dissolved in water only by stirring at room temperature (about 25° C). To this mixed aqueous solution, as a compound having a fading property to light for exposure, 10 g of diazo compound

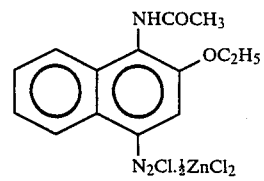

was dissolved and used as the contrast enhanced material for forming pattern. This material presented an absorption peak at 436 nm of the light for exposure, and indicated the coefficient A of 13.5 showing the degree of contrast enhancement at 436 nm. The ultraviolet spectral curve of contrast enhanced material for forming pattern of this invention is shown in FIG. 2. At 436 nm, it is known that the ratio of transmission before and after exposure is great. Using this material, the pattern forming method of this invention for forming resist pattern is shown in the drawing.

A photoresist 2 is applied by rotation on a substrate 1 made of semiconductor or the like (FIG. 1A). On this substrate 1, wiring, insulator and other steps are formed, but effects of such steps may be decreased by adjusting the film thickness. Next, on the positive photoresist 2, a layer 4 of contrast enhanced material for said pattern forming with transmission of, for example, about 3% is applied by rotation in a thickness of 0.3 μm or less (FIG. 1B). Then, by reduction projection method, light 3 of 436 nm is selectively emitted to expose a pattern (FIG. 1C). In this step, the exposed portion of the layer 4 has a transmission of, for example, over 97% with respect to the light for exposure as a result of fading action. Using an ordinary alkaline developer which is a developing fluid of the positive resist, the layer 4 of the pattern forming organic material which is the layer of the contrast enhancement is removed, and, at the same time, the exposed portion of the resist 2 is removed, and a resist pattern 2a is formed (FIG. 1D).

In FIG. 1C, since formation of bubbles due to exposure is not recognized, the defect of resist pattern 2a is not found at all in FIG. 1D, and a superfine resist pattern with resolution of 0.35 μm with an enhanced contrast was obtained.

(EXAMPLE 2)

In the same quantity of mixed aqueous solution shown in Example 1, 10 g of a diazo compound

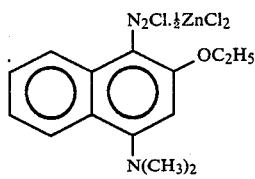

was dissolved to be used as a contrast enhanced material for forming pattern. This material indicated an absorption peak near the wavelength of 436 nm, and the coefficient A at 436 nm was 11.0. By using this material, a resist pattern of high contrast and high resolution of 0.45 μm was obtained in the same manner as in Example 1.

The fading reagent used in this invention is a diazo compound possessing an electron donor group, and aside from the reagent disclosed in the embodiment,

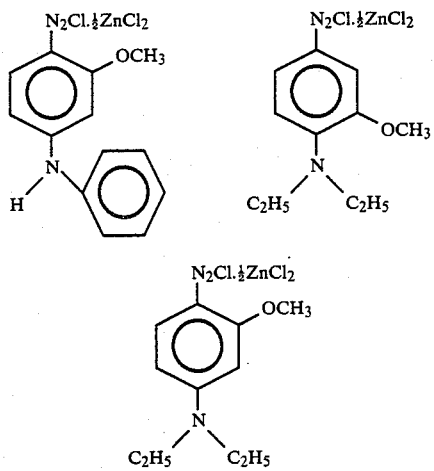

may be used, and when used as contrast enhanced material for pattern forming at 436 nm, it has been confirmed that the value of A is more than 10. By using such reagents, the light for exposure is absorbed by, for example, more than 97%, and after exposure, the transmission of exposed part may be more than 97%, so that a resist pattern of 0.5 μm or less may be obtained without lowering of throughput. An example of initial transmission of 3% and after-exposure transmission of 97% was explained, but these figures may be over 3% and under 97% by selecting the film thickness of contrast enhanced layer for pattern forming with respect to the value of A.

Examples of mixture of water-soluble organic matters relatively high and low in gas permeability as the contrast enhanced material for pattern forming used in this invention may include, among others, combinations of pullulan and polyvinyl pyrrolidone, pullulan and polyethylene glycol, pullulan and polyethylene oxide, polyvinyl alcohol and polyvinyl pyrrolidone, polyvinyl alcohol and polyethylene glycol, polyvinyl alcohol and polyethylene oxide, pullulan and pullulan acetate, polyvinyl alcohol and pullulan acetate, cellulose and polyvinyl pyrrolidone, cellulose and polyethylene glycol. Cellulose and polyethylene oxide, and cellulose and pullulan acetate.

Incidentally, if the diazo compound in the contrast enhanced material of this invention was bonded with water-soluble polymer in any form (such as hydrogen bonding), the effect was not changed at all, and the same excellent result was obtained.

Such example may be as follows.

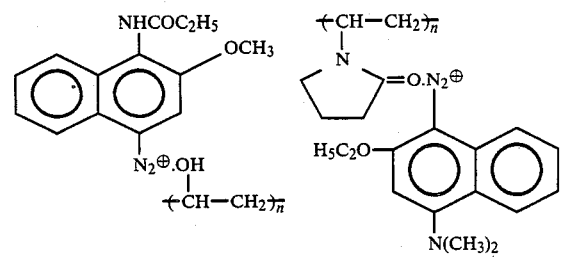

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A pattern forming method comprising:
   a step of applying on a photoresist applied on a substrate, a contrast enhanced film for pattern forming which is capable of being entirely dissolved in a water-based solvent whether exposed to light or not, said contrast enhanced film containing either a photoreactive reagent represented by the formula:

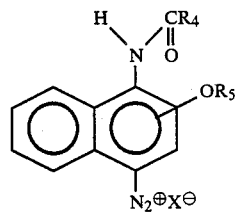

wherein $R_4$ and $R_5$ are methyl or ethyl and $X^{3\ominus}$ is an anion capable of forming a diazonium salt; water-soluble polymer and water, or containing a water soluble polymer which is hydrogen bonded to the photoreactive reagent and water-soluble polymer and water;

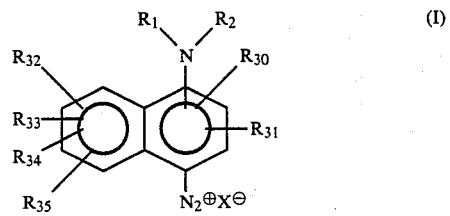

a step of selectively exposing said photoresist and contrast enhanced film to light of about 436 nm; and a step of removing said contrast enhanced film and developing said photoresist so that the exposed portion of said photoresist is removed and the unexposed portion of said photoresist remains to form a pattern.

2. A pattern forming method as set forth in claim 1, wherein said water-soluble polymer is a mixture of a water-soluble organic matter inferior in gas permeability and a water-soluble organic matter superior in gas permeability.

3. A pattern forming method as set forth in claim 1, wherein said water-soluble polymer is a water-soluble organic matter selected from any one of or combining some of pullulan, polyvinyl alcohol, polyvinyl pyrrolidone, polyethylene glycol, polyethylene oxide, and cellulose.

* * * * *